(12) United States Patent
Maciver et al.

(10) Patent No.: US 6,646,198 B2
(45) Date of Patent: Nov. 11, 2003

(54) DEVICES TO REDUCE ELECTRO-MAGNETIC FIELD RADIATION

(75) Inventors: Mark Alasdair Maciver, Bridge of Weir, Renfrewshire (GB); Andrew Ramsey Knox, Kilbirnie (GB)

(73) Assignee: International Busines Machines Corporation, Armonk, NY (US)

( * ) Notice: Subject to any disclaimer, the term of this patent is extended or adjusted under 35 U.S.C. 154(b) by 0 days.

(21) Appl. No.: 09/683,479

(22) Filed: Jan. 4, 2002

(65) Prior Publication Data

US 2002/0117314 A1 Aug. 29, 2002

(30) Foreign Application Priority Data

Feb. 28, 2001 (GB) ............................................. 0104910

(51) Int. Cl.⁷ ................................................. H05N 9/00
(52) U.S. Cl. .................... 174/35 R; 336/84 R; 361/818
(58) Field of Search .......................... 174/35 R, 35 GC, 174/35 MS, 35 CE; 277/920; 336/84 R, 84 C, 84 M; 439/927; 361/800, 816, 818; 206/719

(56) References Cited

U.S. PATENT DOCUMENTS

| | | | | |
|---|---|---|---|---|
| 3,904,886 A | * | 9/1975 | Ehling et al. ................ 307/89 |
| 4,296,376 A | * | 10/1981 | Bartol, Jr. ................... 324/235 |
| 4,605,899 A | * | 8/1986 | Eumurian et al. ........... 324/258 |
| 4,968,854 A | * | 11/1990 | Benn et al. ............ 174/35 GC |
| 5,431,264 A | * | 7/1995 | Tseng et al. ................... 191/10 |
| 5,942,893 A | * | 8/1999 | Terpay ................... 324/207.18 |
| 5,969,609 A | * | 10/1999 | Murdoch ................... 340/572.1 |
| 6,197,408 B1 | * | 3/2001 | Kanbara et al. ............. 428/209 |
| 6,349,038 B1 | * | 2/2002 | Hailey .......................... 361/794 |
| 6,480,088 B2 | * | 11/2002 | Okamoto ..................... 336/229 |
| 6,489,663 B2 | * | 12/2002 | Ballantine et al. .......... 257/531 |
| 6,509,807 B1 | * | 1/2003 | Anthony et al. ............... 333/12 |
| 6,534,707 B1 | * | 3/2003 | Bator et al. ................ 174/35 R |

* cited by examiner

*Primary Examiner*—Dean A. Reichard
*Assistant Examiner*—Adolfo Nino
(74) *Attorney, Agent, or Firm*—Anthony J. Canale

(57) ABSTRACT

Apparatus for reducing electromagnetic field radiation from an electrically conducting enclosure is disclosed. The apparatus comprises an electrically conducting element having two extremities and in which the electromagnetic field radiation induces a current, and an electrical resistance connected between the two extremities of the electrically conducting element so as to absorb the electromagnetic field radiation. In an embodiment to absorb electric field energy, the element is a substantially linear conducting element which absorbs electric field radiation and the electrical resistance has a direct electrical connection to a first extremity of the electrically conducting element. In an embodiment to absorb magnetic field energy, the element is a substantially circular conducting element which absorbs magnetic field radiation, each end of the electrical resistance having a direct connection to a respective extremity of the substantially circular conducting element.

10 Claims, 2 Drawing Sheets

DEVICES TO REDUCE ELECTRO-MAGNETIC FIELD RADIATION

BACKGROUND OF THE INVENTION

1. Filed of the Invention

The present invention relates to devices to reduce the radiation of electro-magnetic fields from enclosures containing electrical or electronic equipment.

2. Background of the Invention

Metal enclosures are often used to contain electronic circuitry. These enclosures interact with the electro-magnetic fields emitted from the circuitry. In the presence of a high frequency component of the electro-magnetic field, enclosures can sustain resonant fields at multiple frequencies. These fields are either absorbed by lossy (resistive) materials contained within the enclosure or are radiated through gaps in the enclosure to the external environment. Such fields contain a magnetic (H) and an electric (E) component.

Radiation to the external environment compromises Electro-Magnetic Compatibility (EMC) performance and can impair the operation of other electronic circuitry. Electro-Magnetic Interference (EMI) is a problem throughout the electronics industry. EMI is subject to regulation by various authorities because stray fields from electrical and electronic equipment can disrupt other electronic equipment such as avionics and pacemakers. Undesirable radio frequency (RF) energy is a pervasive problem for EMI. Where practical, RF emissions are minimized by circuit design and track layout.

EMI solutions usually entail the containment of the RF energy within an enclosure using shielding and gaskets. Additionally, ferrites are often used to dissipate undesirable RF energy present on signal wires and power cables. The ferrites are physically located close to the target fields. The ferrites requires a direct physical or electrical (galvanic) connection to the electronics.

BRIEF SUMMARY OF THE INVENTION

The invention described herein provides a degree of absorption for magnetic fields and for electric fields within an enclosure which does not rely on shielding, gaskets, or the use of ferrites as a purely absorbing element.

Accordingly, the invention provides apparatus for reducing electromagnetic field radiation within an electrically conducting enclosure comprising an electrically conducting element having two extremities and in which the electro-magnetic field radiation induces a current and an electrical resistance connected between the two extremities of the electrically conducting element so as to absorb the electro-magnetic field radiation. The element acts to receive the electromagnetic field energy which is then converted to heat energy by the electrical resistance. This has the advantage over the prior art that the energy is dissipated by conversion to heat, rather than contained as is the case when screening and gaskets are used.

In a first embodiment, the element is a substantially linear conducting element which absorbs electric field radiation and the electrical resistance has a direct electrical connection to a first extremity of the electrically conducting element. This embodiment is directed at the absorption of electric field energy.

In a second embodiment, the element is a substantially circular conducting element which absorbs magnetic field radiation, each end of the electrical resistance having a direct connection to a respective extremity of the substantially circular conducting element. This embodiment is directed at the absorption of magnetic field energy.

Preferably, the substantially circular conducting element comprises multiple turns. increased for a given magnetic flux density.

In a preferred embodiment, the element further comprises a high permittivity material located within the loop formed by the element and the resistance. This has the advantage of increasing the magnetic flux within the loop as compared to the magnetic flux density outside the loop and hence the energy absorbed is increased.

In a particularly preferred embodiment, the element is formed on a printed circuit board. Fabrication of the element can then be done by any of the well known techniques used for fabrication of printed circuit boards at no additional cost.

In the present invention, the target fields are physically separate from the circuitry and the device requires no direct physical or electrical (galvanic) connection to the electronics.

BRIEF DESCRIPTION OF THE SEVERAL VIEWS OF THE DRAWINGS

Embodiments of the invention will now be described, by way of example, with reference to the accompanying drawings, in which.

DETAILED DESCRIPTION OF THE INVENTION

Figure 1:
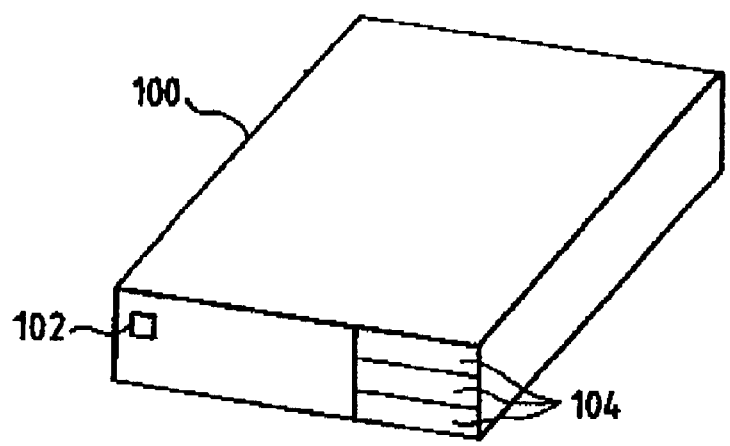
FIG. 1 shows a conducting enclosure for use with a personal computer.

An air-filled rectangular conducting enclosure such as is commonly used to enclose a personal computer may be considered to have some of the properties of a waveguide if considered as an idealized structure. As the enclosure resonates, standing waves are created for electric and magnetic field components within the volume of the enclosure. FIG. 1 shows such a conducting enclosure 100 as is used for a personal computer. In the conducting enclosure 100 is shown various openings such as slots 104 to receive storage devices and opening 102 to receive a power switch. The present invention is not restricted to applicability for personal computers, but may be used for any equipment which has an air-filled cuboid conducting enclosure.

Figure 2:
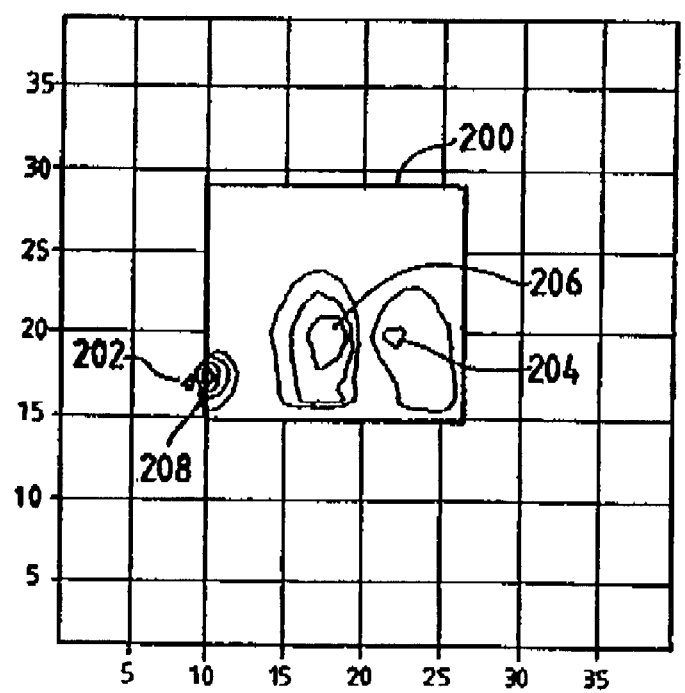
FIG. 2 is a plot of the instantaneous magnetic field for a slice taken through the enclosure of FIG. 1.

FIG. 2 illustrates the instantaneous magnetic field ($H_z$ component) within an enclosure 200 containing a slot 202. The magnetic field is shown for a slice taken through a plane parallel to the z-axis through the enclosure 200. The x and y axes of the figure represent distance. Maxima of the magnetic field can be seen in two places 204, 206 within the enclosure 200 and 208 at the slot 202 located on a wall of the enclosure 200. The instantaneous electric field ($E_z$ component) also has a distribution similar to that of the instantaneous magnetic field shown in FIG. 2.

Dimensions have been excluded from FIG. 2 for clarity although a typical computer enclosure was used to provide a typical result. In addition to enclosure resonances, apertures and slots resonate in the presence of RF energy. Enclosures are manufactured in different shapes and sizes. Where an electro-magnetic field is contained within a conducting enclosure, problems of resonance and shielding are often present to varying degrees.

A magnetic field cutting through a conducting loop will result in an induced current. By positioning and orientating such a conducting loop appropriately, the magnetic flux cutting the conducting loop and therefore the induced current may be maximized. This principle may be used to dissipate unwanted RF energy from within an enclosure.

Figure 3:
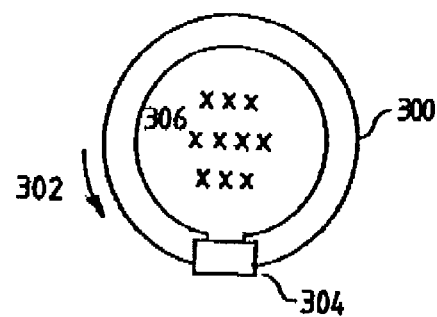
FIG. 3 shows a first embodiment of the present invention for absorbing magnetic field energy.

FIG. 3 illustrates this concept. Magnetic flux 306 cutting a loop 300 of arbitrary shape induces a current I 302. Current 302 flows through resistance R 304, dissipating RF energy. As is well known, the power dissipated is equal to $I^2 \times R$. The dissipation is a function of the magnetic flux 306 cutting the loop 300 (loop area) and the resistance R 304. The absorption will be largely independent of frequency as the resistance 304 will tend to dominate the parasitic passive properties of the loop 300. The device of FIG. 3 may be fabricated onto a printed circuit board. Several such devices may also be used within an enclosure 200, located near magnetic field maxima 204, 206, 208, for example, near resonating structures such as slots 202. The loop 300 may extend to multiple turns (solenoidal) to increase the induced current. The multiple turns may be achieved by using multiple layers on a printed circuit board connected with vias to form a solenoid. The loop may contain a high permittivity material within the loop area so as to increase the magnetic flux which cuts the loop. In an embodiment of a loop located on a printed circuit board, the high permittivity material is also located on the printed circuit board. Resistance R 304 is representative of any dissipating resistance. For example, this may be resistance due to skin effect (low conductivity coating), a surface mount resistor or ferrite, or even a lossy dielectric substrate.

Figure 4:
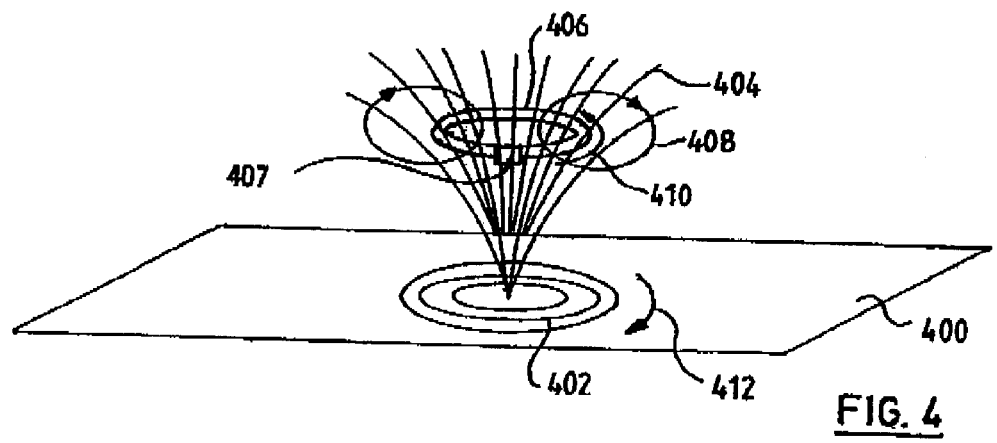
FIG. 4 shows the magnetic field arising from circulating currents on the wall of the enclosure of FIG. 1.

A first embodiment of the present invention for the absorption of magnetic fields will now be described. FIG. 4 illustrates the magnetic field 404 arising from circulating electrical currents 412 on an enclosure wall 400. This alternating magnetic field 404 is intercepted by a conducting loop 406 generating an internal current 410 and associated magnetic field 408. Internal current 410 flows through a resistance R 407.

The presence of a magnetic loop 406 within the near-field of a resonant surface 400 will modify the properties of the magnetic and electric fields associated with that resonant surface. Exact solutions for simple configurations and numerical solutions for complex configurations may be calculated. However, the nature of most electronic enclosures is such that the calculation of exact solutions for the resulting fields are rarely practical. Numerical approximations can be developed to estimate the RF absorption of the device of FIG. 4.

A second embodiment of the present invention for the absorption of electric fields will now be described. Electric fields across a conductor will result in an induced current. By positioning this conductor appropriately, the electric field intercepted by the conductor, and therefore the current induced in the conductor, may be maximized. This principle may be used to dissipate unwanted RF energy from within an enclosure.

Figure 5:
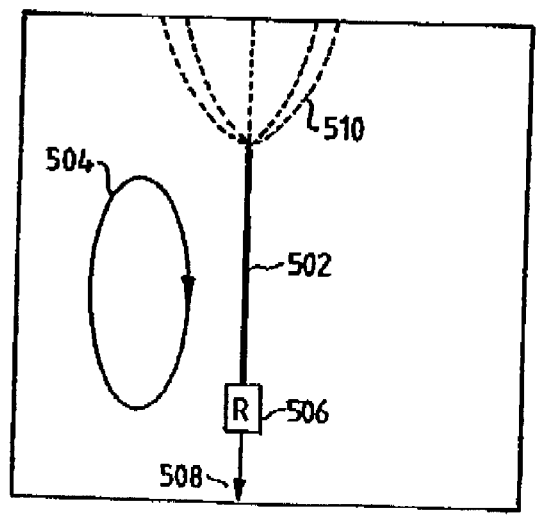
FIG. 5 shows a second embodiment of the present invention for absorbing electrical field energy.

FIG. 5 illustrates the concept. Electric flux 510 from the enclosure walls (in this example) appears across a conductor 502 of arbitrary shape. This induces a current, I which flows through resistance R 506, dissipating RF energy. As is well known, the power dissipated is equal to $I^2 \times R$. The dissipation is a function of the electric flux 510 across the conductor 502 and the resistance R 506. The current loop 504 should not be larger than a half wavelength of the field to be absorbed and should be kept to a minimum to avoid electric flux cancellation and self-resonance.

The device shown may be fabricated onto a printed circuit board or extend into the cavity as would an antenna. Several such devices may also be used within an enclosure, located near electric field maxima, for example, near resonating structures such as slots. A current return path 508 is required to complete the circuit. To maximize the intercepted E-Field, the ends of the rod may be enlarged, for example, to be plates.

Resistance R is representative of any dissipating resistance within this circuit. For example, this could be resistance due to skin effect (low conductivity coating), a surface mount resistor or ferrite, or even a lossy dielectric substrate.

Loops or antennae within resonant cavities are generally used to feed a signal into or extract a signal from a microwave cavity. Such antennae interface to electronic circuitry which transmits a signal to or receives a signal from the loop or antenna. This invention uses a stand-alone conductor (as part of a current loop) to absorb and dissipate unwanted radio-frequency (RF) energy from the electric field or a stand-alone conducting loop to absorb and dissipate radio-frequency energy from the magnetic field.

The net effect is to reduce the undesirable RF energy within an enclosure or near any other (resonant) structure. This may be extended to resonances in the vicinity of slots and apertures acting as parasitic antennae.

As discussed previously, this invention may be fabricated inexpensively on a printed circuit board using low cost components. Although illustrative embodiments and its advantages have been described in detail hereinabove, they have been described by way of example and not by way of limitation. Various changes, substitutions and alterations can be made in the illustrative embodiments without departing from the breadth, scope and spirit of the present invention.

What is claimed is:

1. Apparatus for reducing electromagnetic field radiation within an electrically conducting enclosure comprising:
   an electrically conducting element having a first and a second extremity, wherein electromagnetic field radiation induces an electrical current in the electrically conducting element; and,
   an electrically resistant element having a first and a second end connected between the first and second extremities to absorb the electromagnetic field radiation.

2. Apparatus of claim 1, wherein the electrically conducting element is a substantially linear conducting element which absorbs electric field radiation, the first end of the electrically resistant element has a direct connection to the respective first extremity of the substantially linear conducting element.

3. Apparatus of claim 1, wherein the electrically conducting element is a substantially circular conducting element which absorbs magnetic field radiation, the first and second ends of the electrically resistant element having a direct connection to the respective first and second extremities of the substantially circular conducting element.

4. Apparatus of claim 3, wherein the substantially circular conducting element comprises multiple turns.

5. Apparatus of claim 1, wherein the electrically conducting element further comprises a high permittivity material located within a loop formed by the electrically conducting element and the electrically resistant element.

6. Apparatus of claim 1, wherein the electrically resistant element comprises a low conductivity layer.

7. Apparatus of claim 1, wherein the electrically resistant element comprises a surface mounted resistor.

8. Apparatus of claim 1, wherein the electrically resistant element comprises ferrite.

9. Apparatus of claim 1, wherein the electrically conducting element is formed on a printed circuit board.

10. Apparatus of claim 9, wherein the printed circuit board comprises multiple layers and the electrically conducting element comprises multiple turns formed by connection of the multiple layers.

\* \* \* \* \*